Sept. 8, 1970 D. C. MILEY 3,527,619

SOLAR CELL ARRAY

Filed April 15, 1968

INVENTOR
DAVID C. MILEY

BY Harvey J. [signature]

ATTORNEY

United States Patent Office 3,527,619
Patented Sept. 8, 1970

3,527,619
SOLAR CELL ARRAY
David C. Miley, Los Altos, Calif., assignor to Itek Corporation, a corporation of Delaware
Filed Apr. 15, 1968, Ser. No. 721,266
Int. Cl. H01l 15/02
U.S. Cl. 136—89 11 Claims

ABSTRACT OF THE DISCLOSURE

A solar cell array formed of a plurality of solar cells in coplanar row and column relationship and interconnected at their corners with adjacent cells. Each solar cell has an upper solar sensitive surface which covers all but two adjacent corners of the solar cell and a conductive lower surface. Further, each corner of the upper surface of the solar cell has a terminal area, the terminal areas in the uncovered corners being spaced from the solar sensitive surface edge. The two terminal areas on the covered corners are connected to current pick-up means extending across the solar sensitive surface, and the two terminal areas on the uncovered corners are connected to the conductive lower surface.

BACKGROUND OF INVENTION

This invention relates generally to solar cell arrays and, more particularly, to the configuration of a solar cell which allows it to be electrically and mechanically in-interconnected with the other cells of the array.

Since each individual, commonly known, solar cell generates only a small amount of power, usually much less power than is required for most applications, the required voltage and current is realized by interconnecting a plurality of solar cells in a series and parallel matrix. This matrix is usually referred to as a solar cell array, and generates electrical energy from solar radiation for a variety of uses.

One desirable characteristic of a solar cell array is that it be as small and light as possible, particularly when used in connection with satellites. This is generally accomplished by designing the solar cell array in such a manner as to expose a maximum area of each solar cell sensitive upper surface to the solar radiation. This requires that the cells be interconnected in such a manner that the interconnection does not materially decrease the exposure of the maximum area.

One method proposed heretofore to interconnect a plurality of solar cells, of the type having a solar sensitive upper surface with current pick-up means and a conductive lower surface, in end-to-end and side-by-side relationship is to form a shingled end-to-end relationship and an electrical contact member side-by-side relationship. In the end-to-end relationship, the cell has its bottom conducting surface eclipsing or overlapping the top surface of the adjacent cell by an amount substantially equal to the width of the current pick-up means that no solar sensitive upper surface area of the cell is eclipsed. Usually, the overlapping portions are directly soldered together resulting in a rigid construction between end-to-end cells. The electrical contact members for the side-to-side (parallel) connection are variously formed.

This construction and arrangement has not proven too satisfactory from a number of points of view. For example, the shingled overlap decreases the usable upper cell surface by about 10%, and the slant of the cells decreases the overall effective sensitive surface still further compared with the area which would be available with a truly coplanar array. Another difficulty with the shingled array is that if one cell becomes defective, many cells have to be removed in order to replace the defective one. A further difficulty is that the cells are directly connected to one another, thereby forming a rigid array which is subject to cracking or breaking under thermal or electrical shock.

To overcome these and other deficiencies of the shingled array, it has been proposed to provide a coplanar array in which the cells are spaced apart and have the bottom surface of one connected to the top surface of the adjacent one through special terminal connecting members. Such a system is shown in U.S. Pat. 3,094,439. This likewise has a number of disadvantages which are immediately evident from the fact that special terminal connecting members have to be made and have to be connected, at opposite ends, to the bottom surface of one cell and the top surface of the adjacent cell.

To overcome these inconveniences, it has been proposed to construct solar cells having terminals with contacts to both the upper and the lower surfaces on the same surface. These constructions, usually referred to as wrap-around configurations, require an oxide-type insulating layer underneath the wrap-around and overlying the extension of one surface over the other. These surfaces, namely, the lower and upper surfaces, are separated by the NP junction usually formed by diffusing an impurity of one conductivity type into the cell body which is of the opposite conductivity type. More particularly, the oxide-type insulating layer is usually disposed around the side of one surface of the cell, and the other surface is extended over the side and the first mentioned surface.

The wrap-around cell has been quite successful in simplifying the construction of arrays since all terminal connections can be made to the same surface of the cell. However, the wrap-around configuration of solar cells has the inherent problem of shunting through the oxide layer which degrades the electrical performance. These shunt connections through the oxide layer usually occur during the manufacture or assembly of the cell, and eliminated many of the advantages of wrap-around solar cells, Further, the required oxide coating entails an additional manufacturing step with the attendant increases in the cost of the cell and which requires that all cells in the array be oriented.

It is therefore a primary object of this invention to provide an improved solar cell having all its contacts on one surface.

It is another object of this invention to provide a solar cell having all contacts on its upper surface without the requirement of a conventional wrap-around construction. In other words, a cell constructed in accordance with the present invention has the advantages incident to wrap-around cells, but does not require an insulating layer over which to wrap the surface.

It is a further object of this invention to provide an improved solar cell array in which the individual solar cells are arranged in coplanar relationship, and in which adjacent cells are easily electrically connected by tabs in contact with adjacent corners.

It is still a further object of the present invention to provide a solar cell array which is simpler, less expensive, more reliable, less subject to thermal and vibration shock, and more efficient than arrays known heretofore.

It is still another object of the present invention to provide a new solar cell configuration in which all electrical connections are made to the corners of the upper cell surface, and in which the solar sensitive surface (P- or N-type material) extends over substantially the entire upper cell surface with the exception of two corners.

SUMMARY OF INVENTION

In accordance with the preferred embodiment of the present invention, each individual solar cell of the array is formed in such a manner that two corners, in the upper surface at one end of the cell, are not covered with the solar sensitive surface (i.e., do not have an underlying PN junction) and, instead, have terminal areas electrically separated from the solar sensitive surface. To make a connection between the generally conductively coated lower cell surface and the separated contact areas, the lower surface is connected along the cell side to the terminal areas. Freeing the uncovered corners from the underlying PN junction is accomplished by etching the solar sensitive surface at the two corners to a depth which exceeds the PN junction depth. The other two corners of the upper surface form terminal areas for the current pick-up conductors overlying the upper (solar sensitive) surface of the cell.

The array is formed by arranging the cells in rows and columns, the columns being formed by opposing the terminal areas connected with the upper surface of one cell with the terminal areas connected to the lower surface of the other cell. In this manner, connecting cells in one column constitute a series connection and in one row constitute a parallel connection. Actual connections are made by interconnecting any four cells by a metal tab in contact with the four immediately adjacent corners of the four cells. In this manner, a different corner of each cell is connected with a different corner of each other cell.

DISCLOSURE OF SPECIFIC EMBODIMENT

Further objects and advantages of the present invention will become apparent to those skilled in the art to which the invention pertains as the ensuing description proceeds.

The features of novelty that are considered characteristic of this invention are set forth with particularity in the appended claims. The organization and method of operation of the invention itself will best be understood from the following description when read in connection with the accompanying drawings in which:

Figures 1, 2, 3, 4:
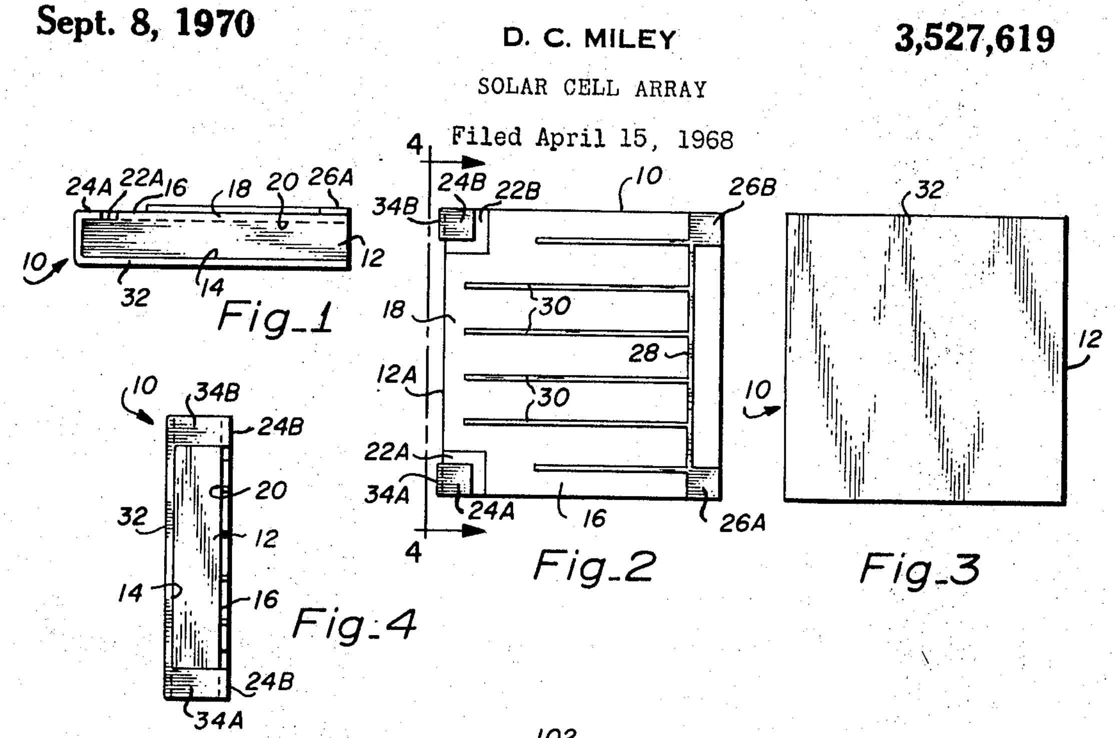
FIG. 1 is an end view of a cell constructed in accordance with the present invention.
FIG. 2 is a top view of the cell of FIG. 1.
FIG. 3 is a bottom view of the cell of FIG. 1.
FIG. 4 is a view taken along lines 4—4 of the cell of FIG. 2.

Referring now to the drawings, and particularly to FIGS. 1–4 thereof, there is shown a solar cell 10 which is constructed in accordance with this invention. Solar cell 10 comprises a body 12 of semiconductive material of one conductivity type which has a lower surface 14 and an upper surface 16. Diffused into body 12, through upper surface 16, is a semiconductive region 18 of the opposite conductivity type which forms a PN junction 20 with underlying body 12.

Conventional solar cells are usually fabricated by utilization of a p-type silicon body and doping the same, in a diffusion furnace, with phosphorous pentioxide to a depth of about 0.4 micron. Such material and doping techniques are likewise usable in constructing the solar cell of the present invention.

As best seen in FIG. 2, doped region 18 defining the extent of PN junction 20, and therefore the solar sensitive cell surface, covers the entire upper surface of body 12 except for corners 22A and 22B which remain uncovered to directly expose the undoped material of body 12 through the upper cell surface.

There are further provided four terminal areas or pads 24A, 24B, 26A and 26B of a conductive material which are disposed upon the upper cell surface. Preferably, the four terminal areas are of equal size, and are respectively positioned to occupy the four corners of the upper surface 16 of cell 10, terminal areas 24A and 24B occupying corners 22A and 22B respectively, and terminal areas 26A and 26B occupying the remaining two corners. In connection with uncovered corners 22A and 22B, it should be noted that they are sized to accommodate terminal areas 24A and 24B without edge contact so that these terminal areas are and remain electrically isolated from doped region 18.

Conductive pads 26A and 26B are connected by a Conductive path 28, which, in turn, has connected thereto a plurality of current pick-up paths, such as 30. Pick-up paths 30 extend across the upper cell surface and form, together with conductive path 28, the current pick-up means for the solar cell, and pads 26A and 26B form the terminals for the current pick-up means.

Lower surface 14 of cell 10 is provided with a conducting surface 32 which generally covers the entire lower surface. Conducting surface 32 is connected to terminal pads 24A and 24B through paths or straps 34A and 34B, respectively. It should be noted that straps 34A and 34B, which connect conductive surface 32 to pads 24A and 24B, do not cross PN junction 20, thereby obsoleting the necessity of an oxide layer below the straps to insure insulation. In other words, even though conductive surface 32 is wrapped around side 12A of cell 10, no insulation is required since the doped region is shaped to allow the wrap-around without overlying.

One way of constructing cell 10 is as follows. After doping the p-type silicon body, previously cut to its final size to form the cell, with phosphorous pentoxide in a diffusion furnace to a depth of approximately 0.4 micron, the lower surface of the doped body is sandblasted to remove the doped outer layer and therefore the lower PN junction. Thereafter, a number of cell bodies so treated are stacked with rubber spacers therebetween. More particularly, the spacer is clamped between the upper surface of one cell which is to form the solar sensitive cell surface, and the lower surface of another cell from which the PN junction has already been blasted. The rubber spacer is provided with corner cut-outs having a size corresponding to corners 22A and 22B to expose these corners. The stacked cell bodies are then immersed in a hydrofluid acid bath which removes all doped regions except those protected by the rubber spacer. The acid treatment will have removed all doped regions except region 18 on the upper cell surface which covers the surface except for corners 22A and 22B.

The processed cell body is then suitably masked so that only certain areas are exposed to form all conductive coatings by vapor deposition in the conventional manner. The exposed portions are the four terminal pads 24A, 24B, 26A and 26B, the current pick-up means formed by conductive path 28 and branches 30, the entire lower surface 14 and straps 34A and 34B on side 12A. The cell so formed is then ready for assembly into an array.

Figure 5:
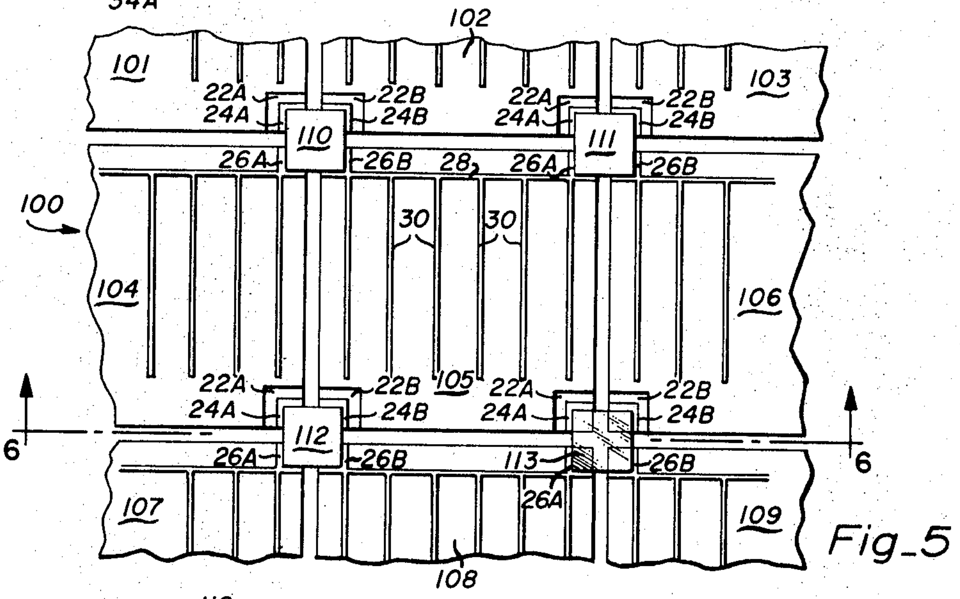
FIG. 5 is a fragmentary top view of a solar cell array constructed of cells such as shown in FIG. 2 upon a substrate.
Figure 6:
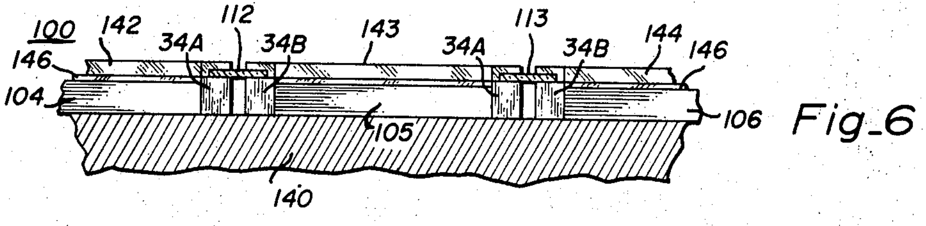
FIG. 6 is a view taken along lines 6—6 of FIG. 5.

Referring now to FIGS. 5 and 6, there is shown a solar cell array 100 which is comprised of a plurality of solar cells of which nine solar cells 101, 102, 103, 104, 105, 106, 107, 108 and 109 are shown. All solar cells have their adjacent corners electrically connected by cell interconnecting tabs 110, 111, 112 and 113. The term adjacent corners is used herein to designate the four corners of four cells which are covered by an interconnecting tab. More patricularly, interconnecting tab 110 interconnects terminal tab 24A of cell 101, terminal tab 24B of cell 102, terminal tab 26A of cell 104, and terminal tab 26B of cell 105. Similarly, cell interconnecting tab 111 connects cells 102, 103, 105 and 106, cell interconnecting tab 112 connecting cells 104, 105, 107 and 108, and cell interconnecting tab 113 connects cells 105, 106, 108 and 109.

It is immediately evident from an inspection of FIG. 5 that row cells such as cells 104, 105 and 106 are connected in parallel, and column cells such as cells 102, 105 and 108 are connected in series with one another. It is further evident that the entire cell interconnections are formed by interconnecting tabs, such as 110, which are simple metal tabs easy to manufacture, light in weight, and easily assembled.

Referring now to FIG. 6, there is shown a cross-sectional view of array 100 which illustrates one method of constructing an array. There is provided a substrate or support body 140 which can be the skin of a missile or other space vehicle and which actually supoprts the array. In practice, cells such as 104, 105 and 106 are cemented, soldered or otherwise affixed with their conductive lower surface, either directly or through an elastic pad, to upper surface of substrate 140. Thereafter, tabs such as 112 and 113 are soldered or otherwise electrically connected to adjacent cell corners to make the four-corner contact illustrated in FIG. 5. Thereafter, cover glasses 142, 143 and 144 are adhesively cemented to the solar sensitive surface of the cells by a suitable adhesive such as shown at 146.

It should be noted that cover glasses 142, 143 and 144 have their corners cut away to fit around the interconnecting tabs. Incidentally, one substantial advantage of removing the corners from the cover glass, in addition to bringing the cover glass closer to the surface so that less adhesive is required, is the fact that the cover glass is securely held in place on the cell surface against lateral displacement so that there is no need to otherwise secure the cover glass during the time necessary for the adhesive to set or harden.

Figure 7:
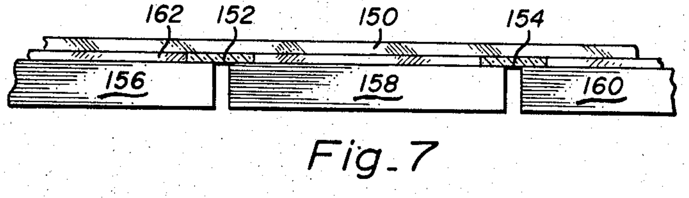
FIG. 7 is a view, similar to that of FIG. 6, of a modified solar cell array.

Referring now to FIG. 7, there is shown an alternate array construction in which an extended cover glass is used as the substrate upon which the array is formed. More particularly, there is provided a cover glass 150, made of a solar radiation transparent material such as Capton, and having a thickness between 2 and 6 mils. The cover glass is placed face down, and a plurality of tab interconnected cells, such as cells 156, 158 and 160, interconnected by tabs 152 and 154, are placed with the solar sensitive surface downwards directly upon the cover glass. A suitable adhesive 162 is interposed between the cover glass and the cells to form a bond therebetween. After setting of adhesive 162, the resulting array may be affixed to or rolled around some suitable support structure.

There has been described a solar cell array which is constructed of cells having all their terminals in one surface. The terminals connected to the bottom surface of the cell are laid upon an undoped region of the upper surface so that the connecting straps or underlying material is of the same type of conductivity as the lower surface and requiring no insulation layers.

What is claimed is:

1. A solar cell configuration comprising:

a body of semiconductive material of one conductivity type defining an upper and a lower surface;

a diffused region of the opposite conductivity type covering the major portion of said upper surface and forming a PN junction therewith, the uncovered portion of said upper surface including an edge portion of said upper surface;

first terminal means disposed on said uncovered portion of said upper surface and spaced from said diffused region;

second terminal means disposed on said covered portion of said upper surface and spaced from said uncovered portion;

first current pick-up means extending across said lower surface of said body and including a conduction path which is connected to said first terminal means, said conduction path being disposed to cross said edge portion; and second current pick-up means extending across said covered portion and connected to said second terminal means.

2. A solar cell configuration in accordance with claim 1 in which said uncovered portion is comprised of at least one corner of said upper surface.

3. A solar cell configuration in accordance with claim 1 in which said uncovered portion comprises two adjacent corners of said upper surface and in which said first terminal means comprises a pair of enlarged terminal areas, one in each of said corners.

4. A solar cell configuration in accordance with claim 3 in which the spacing between the periphery of said enlarged terminal areas and the edge of said covered portion is substantially constant.

5. A solar cell configuration in accordance with claim 3 in which said second terminal means comprises a further pair of enlarged terminal areas, one in each of the corners of said covered portion.

6. A solar cell configuration in accordance with claim 5 in which all enlarged terminal areas are substantially of the same size and respectively occupy the four corners of said upper surface.

7. A solar cell construction comprising:

a substantially rectangular body of semiconductive material of one conductivity type having an upper and lower surface;

a region of the opposite conductivity type diffused into said upper surface to form a solar radiation sensitive junction therewith, said diffused region covering all but two corners of said upper surface and thereby defining two uncovered corners;

a first conductive member including, an enlarged terminal area disposed in each covered corner, a path on said upper surface between said terminal areas of said covered corner, and at least one elongated current pick-up path extending on said upper surface from said path; and a second conductive member including, an enlarged terminal area disposed in each said uncovered corner, a current pick-up surface extending across said lower surfaces, and a path along one side surface of said body extending between said pick-up surface and said terminal areas at said uncovered corners.

8. A solar cell construction in accordance with claim 7 in which all enlarged terminal areas are substantially identical.

9. A solar cell construction in accordance with claim 8 in which a plurality of such solar cells are disposed in side-by-side relationship in rows and columns and in which the interconnections are formed by tabs each of which is connected to the four immediately adjacent corners of four adjacent cells.

10. A solar cell array comprising:

a plurality of coplanar, spaced apart, solar cells arranged in rows and columns;

each solar cell being of substantially rectangular configuration and having a solar radiation sensitive surface which covers all but two corners of the upper surface of the solar cell, a terminal area in each of the four corners of the upper surface of the solar cell, the terminal areas occupying the uncovered corners being spaced from said radiation sensitive surface;

first current pick-up means in contact with said radiation sensitive surface and connected to the terminal areas in the two covered corners;

second current pick-up means in contact with the uncovered portion of the solar cell and connected to the terminal areas in the two uncovered corners; and connecting tabs conductively connecting immediately adjacent solar cells by connecting their immediately adjacent four terminal areas, two of said four terminal areas being adjacent corners from two cells in a row and two of such four terminal areas being adjacent corners for two cells in a column, the columns and row cells being connected in series and parallel.

11. A solar cell array in accordance with claim 10 in which each cell is covered by a cover glass which is shaped to conform to the radiation sensitive cell surface not covered by said terminal areas at the corners.

References Cited

UNITED STATES PATENTS

| | | | |
|---|---|---|---|
| 3,255,047 | 6/1966 | Escoffery | 136—89 |
| 3,350,775 | 11/1967 | Iles. | |
| 3,359,137 | 12/1967 | Kaye et al. | 136—89 |
| 3,411,952 | 11/1968 | Ross et al. | 136—89 |
| 3,450,568 | 6/1969 | Mann | 136—89 |

ALLEN B. CURTIS, Primary Examiner